United States Patent [19]
Muraoka

[11] Patent Number: 5,886,916
[45] Date of Patent: Mar. 23, 1999

[54] ANALOG MULTIPLIER

[75] Inventor: Takashi Muraoka, Tokyo, Japan

[73] Assignee: NEC Corporation, Tokyo, Japan

[21] Appl. No.: 949,184

[22] Filed: Oct. 10, 1997

[30] Foreign Application Priority Data

Oct. 11, 1996 [JP] Japan .................................. 8-289152

[51] Int. Cl.[6] .............................. G06F 7/16; G06F 7/44
[52] U.S. Cl. ........................................... 364/841; 327/356
[58] Field of Search .................................. 364/841, 844;
327/355, 356, 357, 358, 359

[56] References Cited

U.S. PATENT DOCUMENTS

| | | | |
|---|---|---|---|
| 4,764,892 | 8/1988 | Thomas | 364/841 |
| 5,115,409 | 5/1992 | Stepp | 364/841 |
| 5,389,840 | 2/1995 | Dow | 364/841 X |

OTHER PUBLICATIONS

Gray, P.R., et al., "Analog IC Design Techniques", 1994, vol. 2, pp. 169–183.

*Primary Examiner*—Chuong Dinh Ngo
*Attorney, Agent, or Firm*—Scully, Scott, Murphy & Presser

[57] ABSTRACT

In an analog multiplier of the present invention, in an input portion for feeding a differential current to the common emitter of each of a first and a second differential pair, the differential current is turned back by a current mirror circuit. This allows transistors limiting an input range to operate over a broad range in the forward active region of the collector potential. As a result, the multiplier achieves a broad input range. Further, the base potentials of transistors limiting an output range are lowered by emitter followers. Therefore, such transistors can operate over a broad range in the forward active region of the collector potential, increasing an output range.

16 Claims, 7 Drawing Sheets

ANALOG MULTIPLIER

BACKGROUND OF THE INVENTION

The present invention relates to an analog multiplier and, more particularly, to an analog multiplier capable of broadening an input range and an output range.

An analog multiplier of the type producing an output proportional to the product of two analog inputs is disclosed in, e.g., "Analog IC Design Techniques" written by P. R. Gray and R. G. Mayor and published by Baifukan in 1994, Vol. 2, pp. 169–183. The problem with conventional analog multipliers including one taught in the above book is that they cannot increase an input range when the power source voltage is low, and cannot increase an output range.

SUMMARY OF THE INVENTION

It is therefore an object of the present invention to provide an analog multiplier capable of increasing an input range even when a power source voltage is low, and increasing an output range also.

An analog multiplier of the present invention includes a first and a second cross-connected differential pair applied with a first input signal voltage and having common emitters respectively driven by differential currents corresponding to a second input signal voltage. A third differential pair is applied with the second input signal voltage. A first and a second current mirror circuit respectively turn back differential output currents output from the third differential pair to thereby feed the differential output currents to the common emitters of the first and second differential pairs. Differential currents proportional to the product of the first and second input signal voltages are output on the cross-connected points of the first and second differential pairs.

BRIEF DESCRIPTION OF THE DRAWINGS

The above and other objects, features and advantages of the present invention will become apparent from the following detailed description taken with the accompanying drawings in which.

DESCRIPTION OF THE PREFERRED EMBODIMENTS

Figure 1:
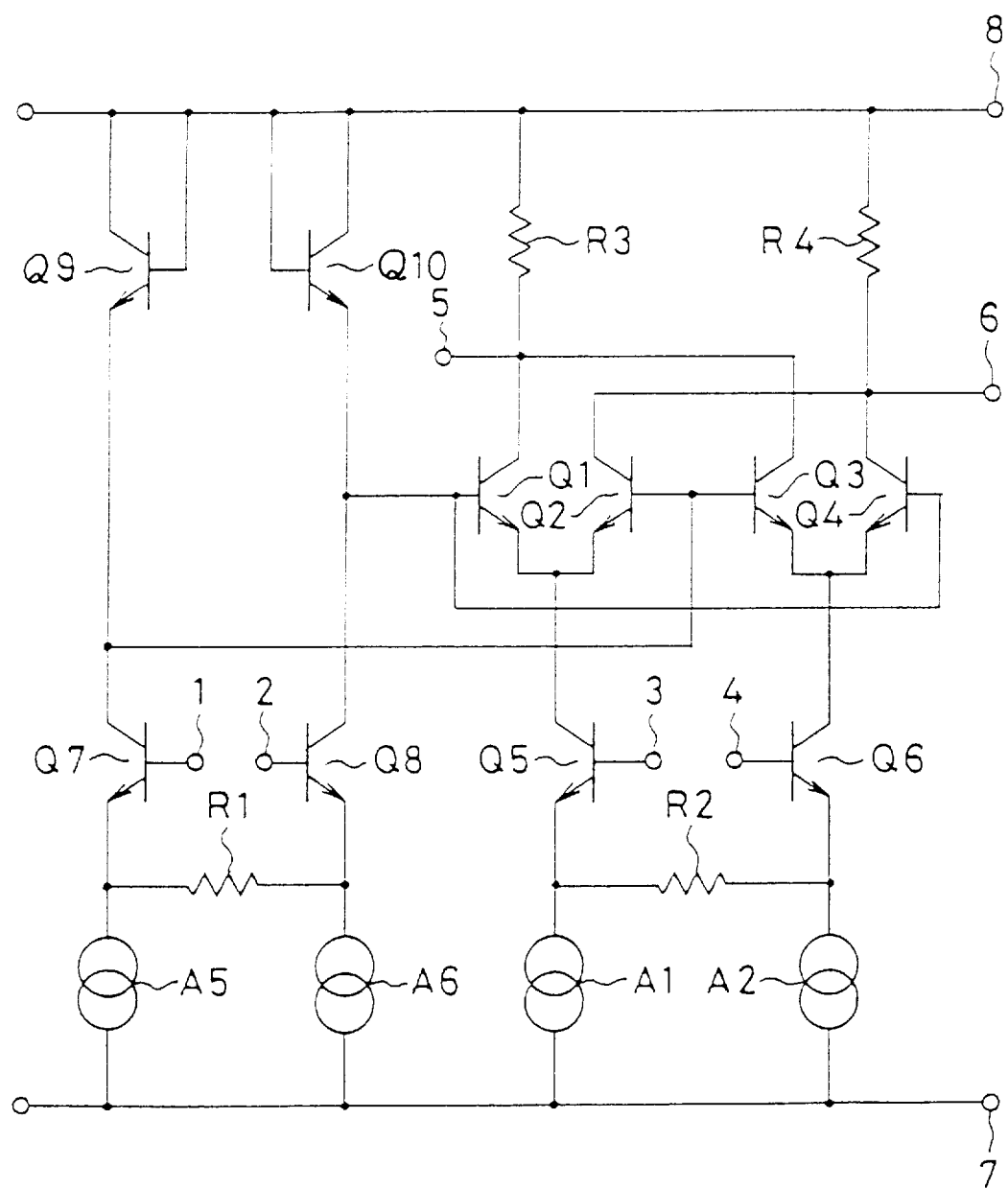
FIG. 1 is a circuit diagram showing a conventional analog multiplier.

To better understand the present invention, brief reference will be made to a conventional analog multiplier, shown in FIG. 1. As shown, the analog multiplier includes a first differential pair Q1 and Q2 and a second differential pair Q3 and Q4 having cross-connected collectors. The differential pair Q1 and Q2 and the differential pair Q3 and Q4 are connected to a power source 8 via load resistors R3 and R4, respectively. A third differential pair Q5 and Q6 has collectors respectively connected to the common emitter of the first differential pair Q1 and Q2 and that of the differential pair Q3 and Q4. The emitters of the third differential pair Q5 and Q6 are connected together by a resistor R2. The differential pair Q5 and Q6, i.e., bipolar transistors Q5 and Q6 are driven by constant currents source A1 and A2, respectively. A fourth differential pair Q7 and Q8 has their emitters connected together by a resistor R1. Bipolar transistors Q7 and Q8 constituting the fourth differential pair are driven by constant current sources A5 and A6, respectively. Active load elements Q9 and Q10 are diode-connected. A first input signal voltage is differentially applied to the fourth differential pair Q7 and Q8. A second input signal is differentially input to the third differential pair Q5 and Q6. The output of the fourth differential pair Q7 and Q8 is differentially input to the first differential pair Q1 and Q2 and second differential pair Q3 and Q4. A differential output voltage appears on cross connection points 5 and 6.

More specifically, the first input signal is differentially applied to an input terminal 1 connected to the base of the bipolar transistor Q7 and an input terminal 2 connected to the base of the bipolar transistor Q8. The resistor R1 is connected between the emitters of the transistors Q7 and Q8. The constant current sources A5 and A6 are respectively connected between the emitters of the transistors Q7 and Q8 and a low power source terminal 7. The collectors of the transistors Q7 and Q8 are respectively connected to the emitters of bipolar transistors Q9 and Q10 whose bases and collectors are connected to a high power source terminal 8.

The second input signal is differentially applied to a n input terminal 3 connected to the base of the bipolar transistor Q5 and an input terminal 4 connected to the base of the bipolar transistor Q6. The resistor R2 is connected between the emitters of the transistors Q5 and Q6. The constant current sources A1 and A2 are respectively connected between the emitters of the transistors Q5 and Q6 and the low power source terminal 7. The collector of the transistor Q5 is connected to the interconnected emitters of bipolar transistors Q1 and Q2. The collector of the transistor Q6 is connected to the interconnected emitters of bipolar transistors Q3 and Q4.

The bases of the transistors Q2 and Q3 are connected to the collector of the transistor Q7 while the bases of t h e transistors Q1 and Q2 are connected to the collector of the transistor Q8. The collectors of the transistors Q1 and Q3 are connected to each other and have their junction 5 connected to one end of the resistor R3. The other end of the resistor R3 is connected to the high power source potential 8. The collectors of the transistors Q2 and Q4 are connected to each other and have their junction 6 connected to one end of the resistor R4. The other end of the resistor R4 is connected to the high power source terminal 8. The output signal of the multiplier differentially appears on the junctions 5 and 6.

In operation, assume that the first input signal is input between the terminals 1 and 2 in the form of a differential input voltage ($=V_1$), and that the base-emitter voltages VBE of the transistors Q7 and Q8 are substantially the same ($V_{BE1} \approx V_{BE2}$). Then, a voltage of the same size as the input voltage $V_1$ is applied to the emitter resistor R1. In this condition, it will be seen that a difference $\Delta I_1$ occurs between the collector current $I_{C7}$ of the transistor Q7 and the collector current $I_{C8}$ of the transistor Q8 ($\Delta I_1 = I_{C7} - I_{C8} = V_1/R1$).

The diode-connected transistors Q9 and Q10 transform the above difference $\Delta I_1$, to a potential difference between their emitters which is proportional to $\tanh^{-1}$ (reversed function of a hyperbolic tangent), as verified by detailed analysis. This shows that the potential difference between the emitters of the transistors Q9 and Q10 is proportional to $\tan h^{-1}$ of the input signal voltage $V_1$.

The potential difference between the output terminals 5 and 6 is proportional to tanh of the potential difference between the transistors Q9 and Q10, as also verified by detailed analysis. Therefore, the differential output voltage is proportional to tanh of $\tanh^{-1}$ of the input potential difference. Consequently, a differential output voltage $V_0$ is proportional to the first differential input signal voltage $V_1$.

Assume that the second input signal is input between the terminals 3 and 4 in the form of a differential input voltage $V_2$, and that the base-emitter voltages of the transistors Q5 and Q6 are the same. Then, a voltage of the same size as the second input voltage $V_2$ is applied to the resistor R2. As a result, it will be seen that a difference $\Delta I_2$ proportional to the input voltage $V_2$ occurs between the collector current $I_{C5}$ of the transistor Q5 and the collector current $I_{C6}$ of the transistor Q6. The differential output potential between the terminals 5 and 6 is proportional to the above difference $\Delta I_2$ and therefore to the second differential input voltage $V_2$ also.

Consequently, the potential difference $V_0$ between the output terminals 5 and 6 is proportional to the product of the potential difference $V_1$ between the input terminals 1 and 2 and the potential difference $V_2$ between the input terminals 3 and 4.

However, the above conventional analog multiplier has the following problems left unsolved. A first problem is that when the potential of the high power source terminal 8 is lowered, it is impossible to increase the input range between the terminals 3 and 4 to which the second input signal is applied. Specifically, the lower limit of the input range is determined by the sum of the voltage between the current sources A1 and A2 and allowing them to operate normally and the base-emitter voltages of the transistors Q3 and Q4. By contrast, as for the upper limit of the input range, the collector potential of the transistor Q5 is a difference produced by subtracting from the potential of the high power source terminal 8 the base-emitter voltage of the transistor Q9 or Q10 and the base-emitter voltage of the transistor Q1 or Q2.

More specifically, assuming that the base-emitter voltage of a bipolar transistor is 0.8 V, then the collector voltage of the transistor Q5 is a difference produced by subtracting 1.6 V from the potential of the high power source terminal 8. This is also true with the transistor Q6. As a result, the upper limit of the input range of the input terminals 3 and 4 is determined. This is why the input range between the input terminals 3 and 4 cannot be increased if the potential of the high power source terminal 8 is low.

A second problem with the conventional analog multiplier is that the output range between the output terminals 5 and 6 cannot be increased. This is because the base voltage of the transistor Q1, for example, is a difference produced by subtracting the base-emitter potential of the transistor Q10 from the potential of the high power source terminal 8. Specifically, assuming that the base-emitter voltage of a bipolar transistor is 0.8 V, then the base voltage of the transistor Q1 is a difference produced by subtracting 0.8 V from the high power source voltage. This is also true with the transistors Q2, Q3 and Q4. Consequently, the output range between the output terminals 5 and 6 is determined by the base-emitter voltages of the transistors Q9 and Q10.

Preferred embodiments of the analog multiplier free from the above problems will be described hereinafter.

1st Embodiment

Figure 2:
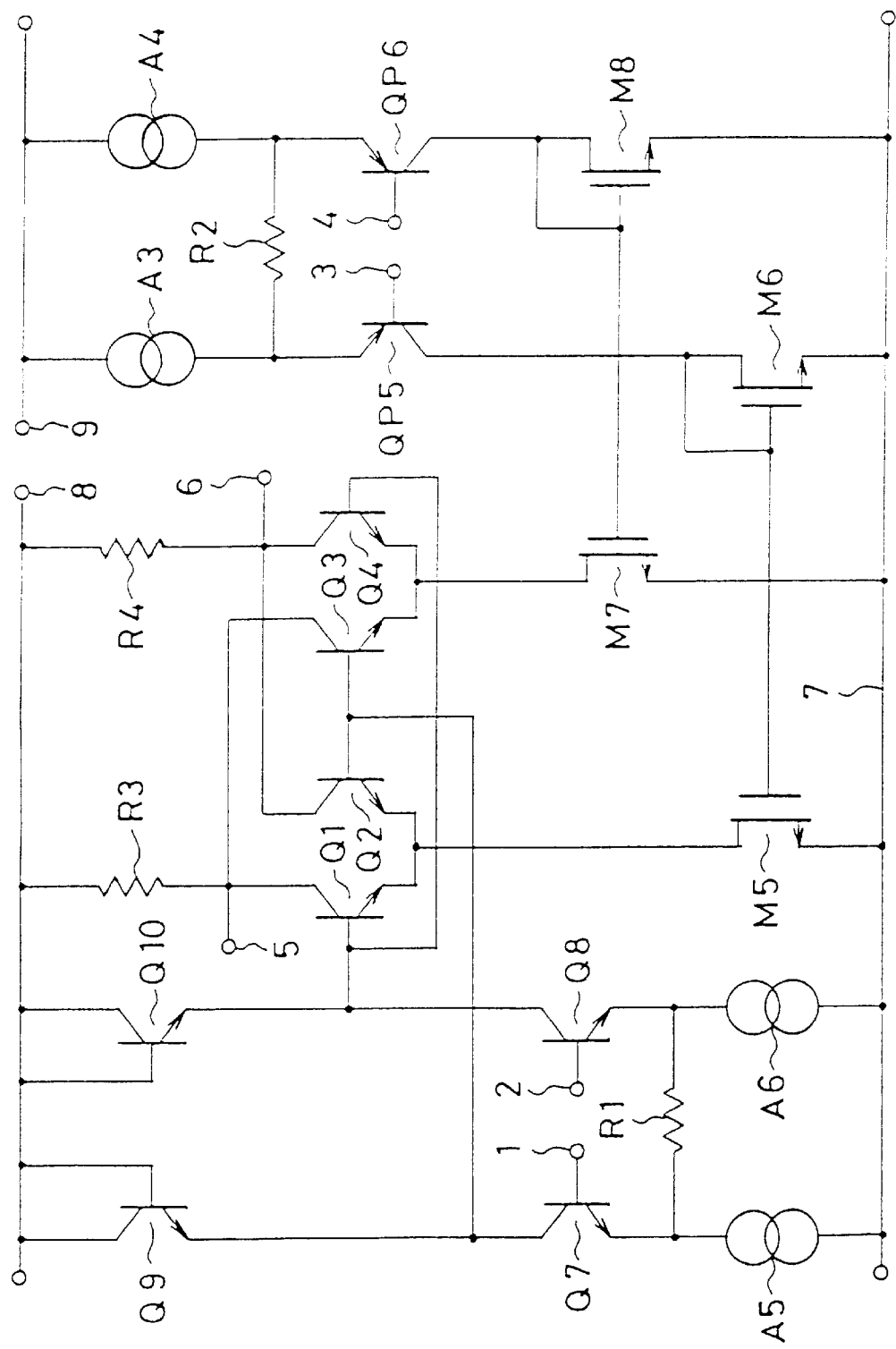
FIGS. 2, 3, 4, 5, 6 and 7 are circuit diagrams respectively showing a first embodiment to a sixth embodiment of the analog multiplier in accordance with the present invention.

Referring to FIG. 2, an analog multiplier embodying the present invention is shown. As shown, the multiplier includes a first differential pair implemented by a first and a second NPN type transistors Q7 and Q8. A first input signal is applied to the bases of the transistors Q7 and Q8 via input terminals 1 and 2. The emitters of the transistors Q7 and Q8 are connected to a low power source terminal 7 via a first and a second constant current source A5 and A6, respectively. A third and a fourth transistor Q9 and Q10, respectively, have their bases and collectors connected to the high power source terminal 8. A second input signal is applied to the bases of a fifth and a sixth PNP type transistor QP5 and QP6 via differential input terminals 3 and 4. The emitters of the transistors QP5 and QP6 are connected to each other by a resistor R2 and connected to the high power source terminal 9 via a third and a fourth constant current source A3 and A4, respectively. The transistors QP5 and QP6 constitute a second differential pair. The collectors of the transistors QP5 and QP6 are respectively connected to the drains of N type MOSFETs M6 and M8.

The MOSFET M6 and an N type MOSFET M5 have their gates connected to each other and to the drain of the MOSFET M6. The sources of the MOSFETs M6 and M5 are connected to the low power source terminal 7. An N type MOSFET M7 and the MOSFET M8 have their gates connected to each other and to the drain of the MOSFET M8. The sources of the MOSFETs M7 and M8 are connected to the low power source terminal 7. In this configuration, the MOSFETs M6 and M5 and the MOSFETs M8 and M7 constitute a first and a second current mirror circuit, respectively.

A seventh and an eighth transistor Q1 and Q2 constitute a third differential pair. The emitters of the transistors Q1 and Q2 are connected to each other. A first and a second transistor Q7 and Q8 have their collectors connected to the bases of the transistors Q1 and Q2, respectively. A ninth and a tenth transistor Q3 and Q4 constitute a fourth differential pair and have their emitters connected to each other. The collectors of the second and first transistors Q8 and Q7 are connected to the bases of the transistors Q3 and Q4, respectively. The emitters of the transistors Q1 and Q2 are connected to the drain of the MOSFET M5 positioned at the output stage of the first current mirror circuit (MOSFETs M5 and M6). The emitters of the ninth and tenth transistors Q3 and Q4 are connected to the drain of the MOSFET M7 positioned at the output stage of the second current mirror circuit (MOSFETs M7 and M8).

The collectors of the seventh and ninth transistors Q1 and Q3 are connected to each other and connected to the high power source terminal 8 via a first load resistor R3. The collectors of the eighth and tenth transistors Q2 and Q4 are connected to each other and connected to the high power source terminal 8 via a second load resistor R4. The junction between the collectors of the transistors Q1 and Q3 and the junction between the collectors of the transistors Q2 and Q4 are connected to differential output terminals 5 and 6, respectively.

In operation, assume that the first input signal is differentially input between the terminals 1 and 2, and that the base-emitter voltages of the transistors Q7 and Q8 are the same. Then, a voltage of the same size as the input voltage is applied to the resistor R1. As a result, a difference proportional to the first input voltage occurs between the collector current of the transistor Q7 and that of the transistor Q8. This difference in current is transformed to a potential difference between the transistors Q9 and Q10 and proportional to $\tanh^{-1}$ by the diode-connected transistors Q9 and Q10, as proved by detailed analysis.

It will therefore be seen that the potential difference between the emitters of the transistors Q9 and Q10 is proportional to $\tanh^{-1}$ of the input voltage. The potential difference between the output terminals 5 and 6 is proportional to tanh of the potential difference between the transistors Q9 and Q10, as verified by detailed analysis. Consequently, the differential output voltage between the output terminals 5 and 6 is proportional to tanh of tanh$^{-1}$ of the input potential difference. This means that the differential output voltage is proportional to the voltage of the first input signal.

Assume that the second input signal voltage is differentially input between the terminals 3 and 4, and that the base-emitter voltages of the transistors QP5 and QP6 are the same. Then, a voltage of the same size as the input voltage is applied to the resistor R2. As a result, a difference proportional to the input voltage occurs between the collector current of the transistor QP5 and that of the transistor QP6.

The difference in collector current between the transistors QP5 and QP6 is directly transferred as a difference between the emitter current of the differential pair Q1 and Q2 and that of the differential pair Q3 and Q4 by the MOSFETs M6 and M5 (first current mirror circuit)) and MOSFETs M8 and M7 (second current mirror circuit).

The potential difference between the output terminals 5 and 6 is proportional to the above difference in emitter current and also to the potential difference between the input terminals 3 and 4.

Consequently, the potential difference between the output terminals 5 and 6 (differential output voltage) is proportional to the product of the potential difference between the input terminals 1 and 2 and the potential difference between the input terminals 3 and 4.

Because the input portion relating to the input terminals 3 and 4 is turned back by the current-mirror circuit, the input range of the input terminals 3 and 4 is increased. Specifically, in the conventional circuit shown in FIG. 1, the collector voltage of the transistors Q5 and Q6 connected to the input terminals 3 and 4, respectively, is a difference produced by subtracting two base-emitter voltages from the power source terminal. By contrast, in the illustrative embodiment, the collector voltage of the transistors QP5 and QP6 connected to the input terminals 3 and 4, respectively, is a difference produced by subtracting the gate-source voltage of a single MOSFET from the power source terminal. The gate-source voltage is obviously lower than the two base-emitter voltages.

2nd Embodiment

Figure 3:
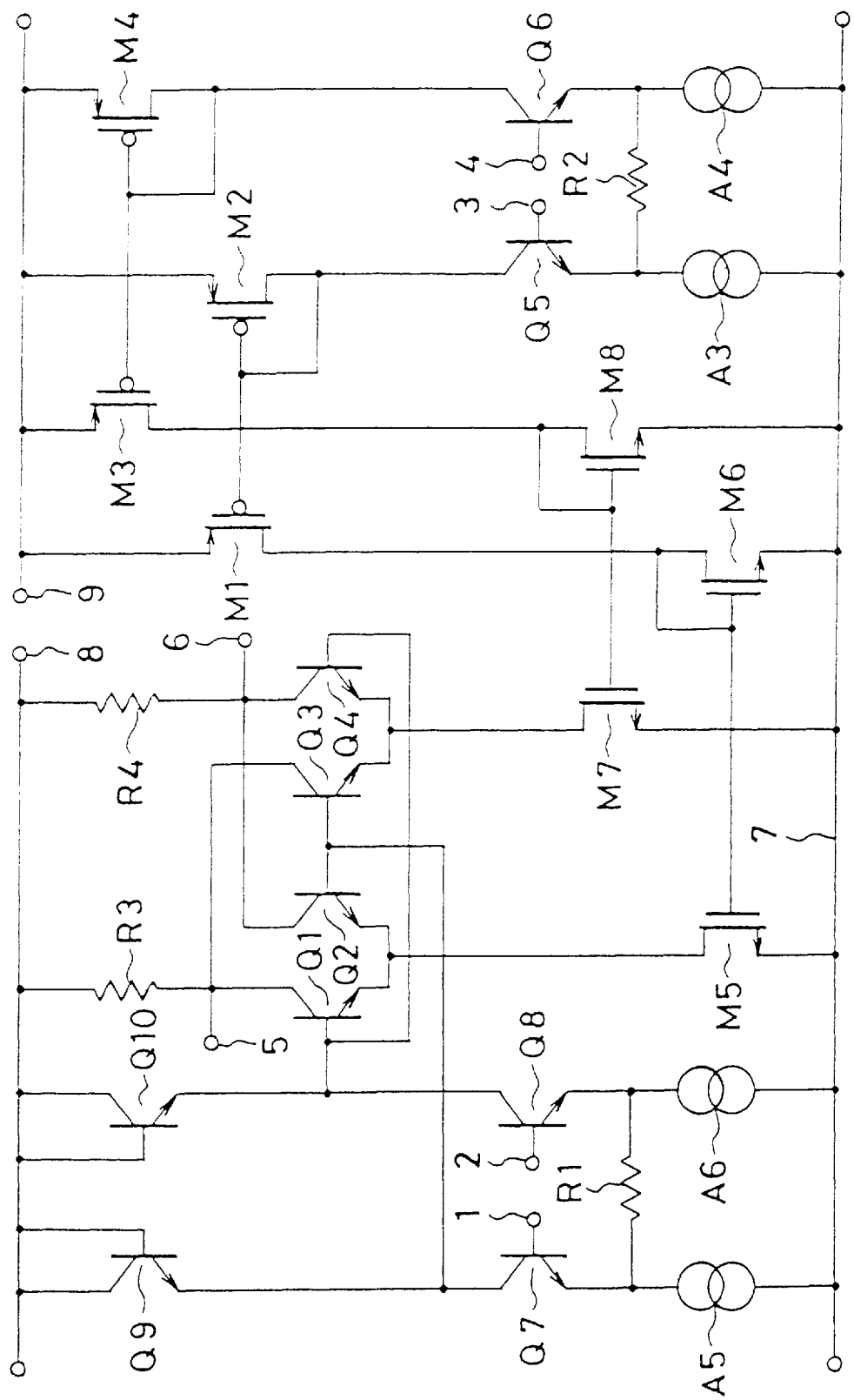

Reference will be made to FIG. 3 for describing a second embodiment of the present invention. In FIG. 3, the same structural elements as the elements shown in FIG. 2 are designated by identical references. The following description will concentrate on the differences between the first and second embodiments.

As shown in FIG. 3, the drain of an N type MOSFET M6 is connected to the drain of a P type MOSFET M1. The source of the MOSFET M1 is connected to the high power source terminal 8. The gate of the MOSFET M1 is connected to the drain and gate of a P type MOSFET M2. The source of the MOSFET M2 is connected to the high power source terminal 8. In this configuration, the MOSFETs M1 and M2 constitute a current mirror circuit.

Likewise, the drain of the N type MOSFET M8 is connected to the drain of a P type MOSFET M3. The MOSFET M3 has its source connected to the high power source terminal 8 and has its gate connected to the drain and gate of a P type MOSFET M4. The source of the MOSFET M4 is connected to the high power source terminal 8. The MOSFETs M3 and M4 constitute a current mirror circuit.

The drain of the MOSFET M2 is connected to the collector of an NPN type bipolar transistor Q5. Likewise, the drain of the MOSFET M4 is connected to the collector of an NPN type bipolar transistor Q6. The base of the transistor Q5 and that of the transistor Q6 are connected to the input terminals 3 and 4, respectively. As for the rest of the construction, the second embodiment is identical with the first embodiment.

With the above configuration, this embodiment basically operates in the same manner as the first embodiment and can broaden the input range between the input terminals 3 and 4. In addition, because the input range between the input terminals 1 and 2 and the input range between the input terminals 3 and 4 are substantially the same, the multiplier shown in FIG. 3 is desirably operable as a squaring circuit also.

3rd Embodiment

Figure 4:
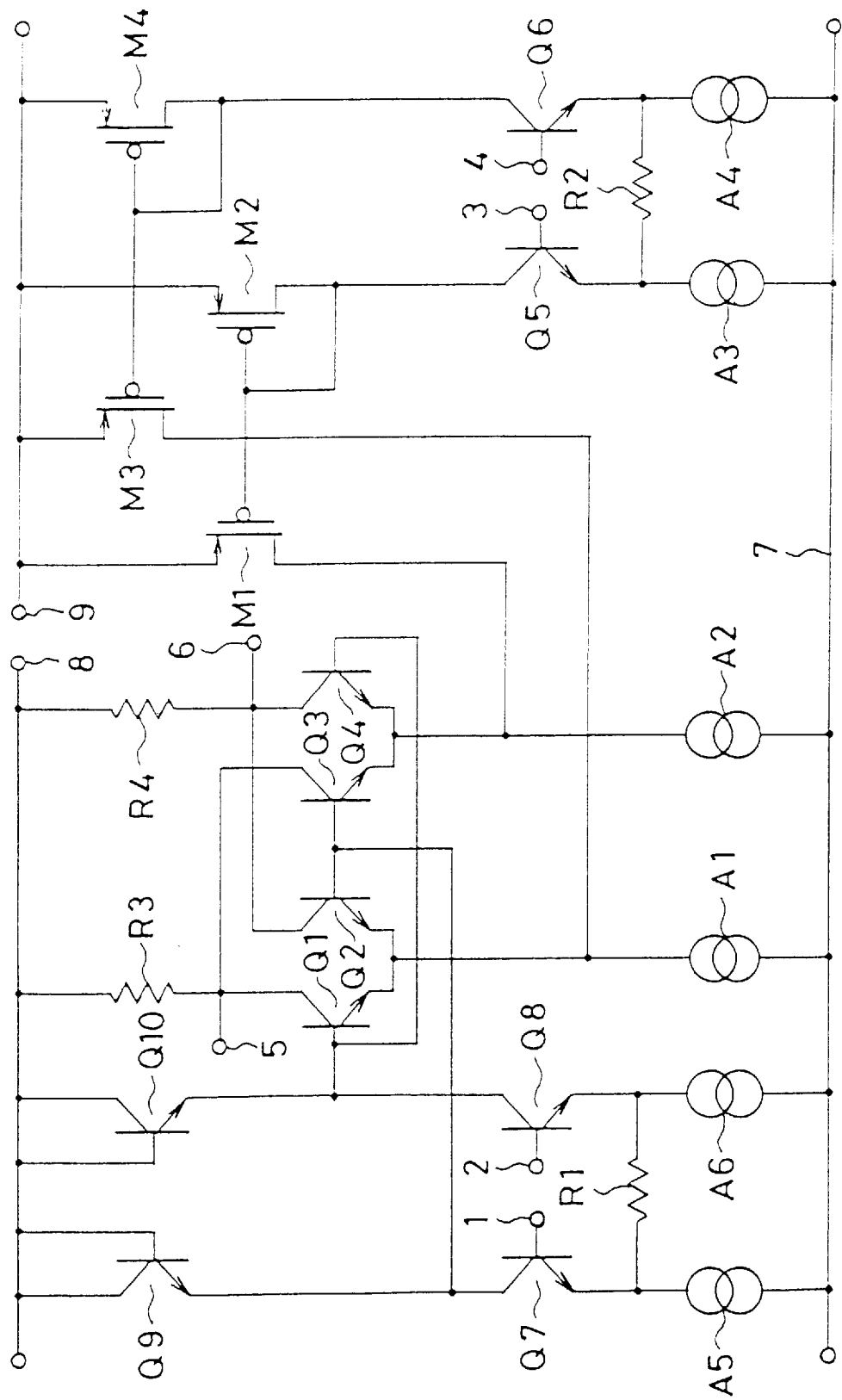

FIG. 4 shows a third embodiment of the present invention. In FIG. 4, the same structural elements as the elements shown in FIG. 3 are designated by identical references. The following description will concentrate on the differences between the second and third embodiments.

In this embodiment, the MOSFETs M5 and M6 and the MOSFETs M7 and M8 shown in FIG. 3 and each constituting a current mirror circuit are absent. As shown in FIG. 4, the drain of the MOSFET M1 is connected to the junction between the common emitter of the transistors Q3 and Q4 and a constant current source A2. The other end of the constant current source A2 is connected to the low power source terminal 7. The drain of the MOSFET M3 is connected to the junction between the interconnected emitters of the transistors Q1 and Q2 and a constant current source A1. The other end of the constant current source A1 is connected to the low power source terminal 7.

Although this embodiment basically operates in the same manner as the second embodiment, it can reduce the influence of, e.g., an offset ascribable to irregularity in the process of MOSFET.

4th Embodiment

Figure 5:
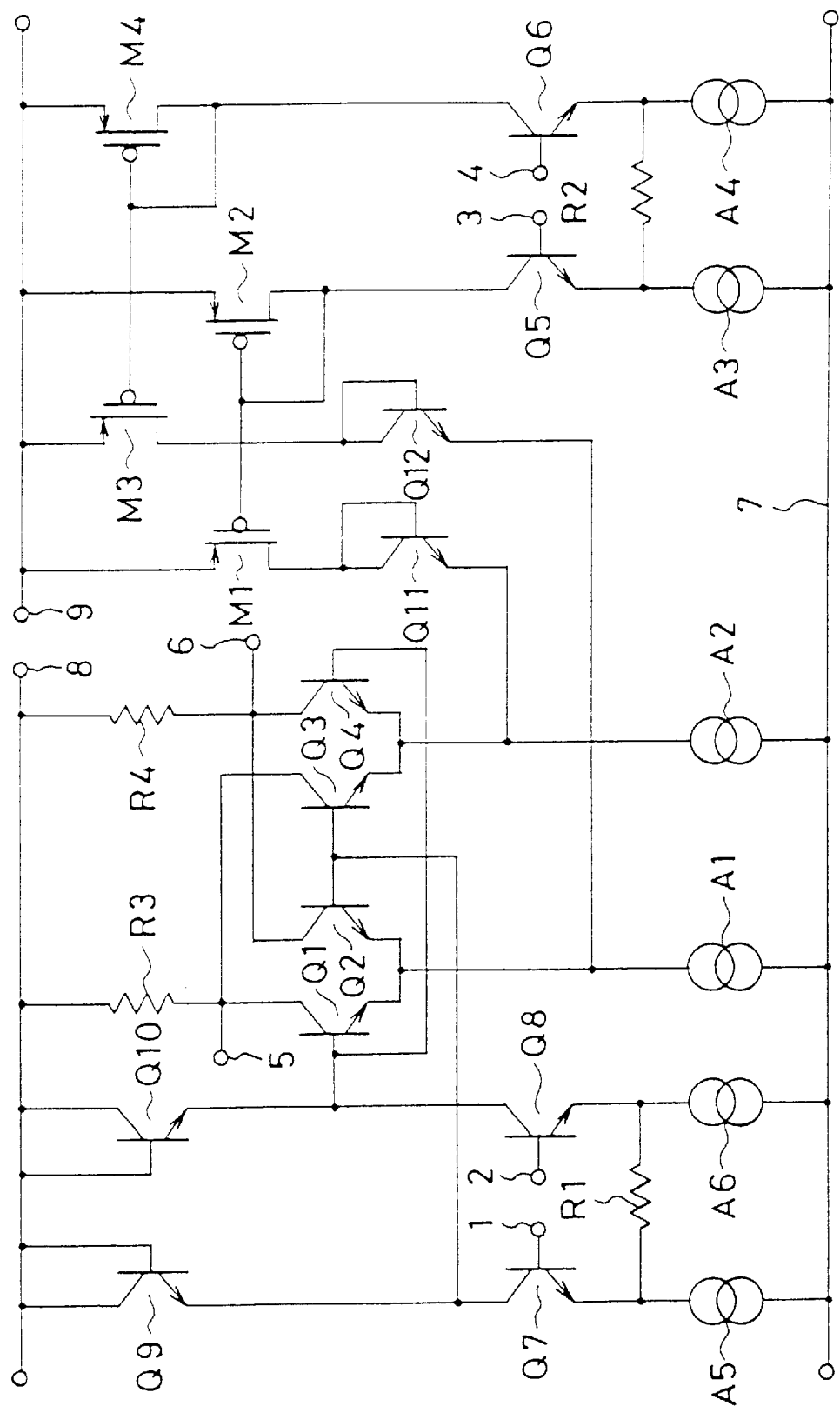

Referring to FIG. 5, a fourth embodiment of the present invention will be described. In FIG. 5, the same structural elements as the elements shown in FIG. 4 are designated by identical references. The following description will concentrate on the differences between the third and fourth embodiments.

As shown in FIG. 5, the drain of the MOSFET M1 is connected to the base and collector of an NPN type bipolar transistor Q11. The emitter of the transistor Q11 is connected to the junction between the interconnected emitters of the transistors Q3 and Q4 and the constant current source A2. Likewise, the drain of the MOSFET M3 is connected to the base and collector of an NPN bipolar transistor Q12. The emitter of the transistor Q12 is connected to the junction between the interconnected emitters of the transistors Q1 and Q2 and the constant current source A1.

This embodiment basically operates in the same manner as the third embodiment. An advantage particular to this embodiment is that a current error ascribable to the current mirror circuits is reduced. This is because a change in drain current ascribable to changes in the source-drain voltages of the MOSFETs M1 and M3 is reduced.

5th Embodiment.

Figure 6:
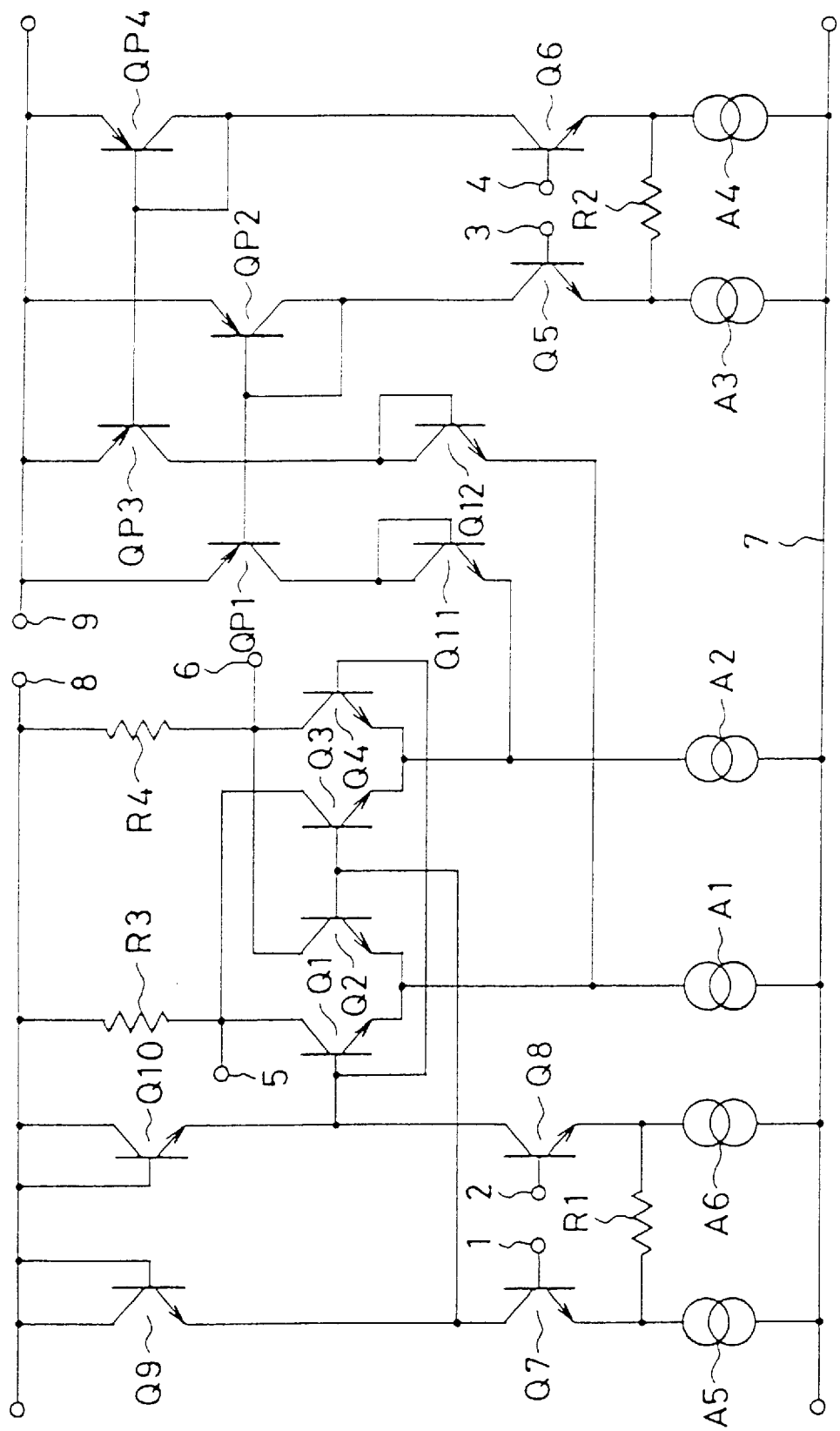

FIG. 6 shows a fifth embodiment of the present invention. In FIG. 6, the same structural elements as the elements shown in FIG. 5 are designated by identical references. The following description will concentrate on the differences between the fourth and fifth embodiments.

As shown in FIG. 6, the collector of the transistor Q5 is connected to the collector and base of a PNP type bipolar transistor QP2. The emitter of the transistor QP2 is connected to a high power source terminal 9. The base of the transistor QP2 is connected to the base of an PNP type bipolar transistor QP1. The emitter of the transistor QP1 is connected to the high power source terminal 9. The transistors QP1 and QP2 constitute a current mirror circuit. The collector of the transistor QP1 is connected to the collector and base of the diode-connected transistor Q11.

Likewise, the collector of the transistor Q6 is connected to the collector and base of a PNP type bipolar transistor QP4. The transistor QP4 has its emitter connected to the high power source terminal 9 and has its base connected to the base of a PNP type bipolar transistor QP3. The emitter of the transistor QP3 is connected to the high power source terminal 9. The collector of the transistor QP3 is connected to the collector of the transistor Q12.

This embodiment basically operates in the same manner as the fourth embodiment. An advantage particular to this embodiment is that a broader range is available between the input terminals 3 and 4. This is because the emitter-base voltages of the transistors QP2 and QP4 shown in FIG. 6, as measured in the forward active region, is lower than the source-gate voltages of the MOSFETs M1 and M2 shown in FIG. 5, as measured in the saturation region. Another advantage is that the bipolar transistors constituting the current mirror circuits increase the operating speed, compared to MOSFETs.

6th Embodiment

Figure 7:
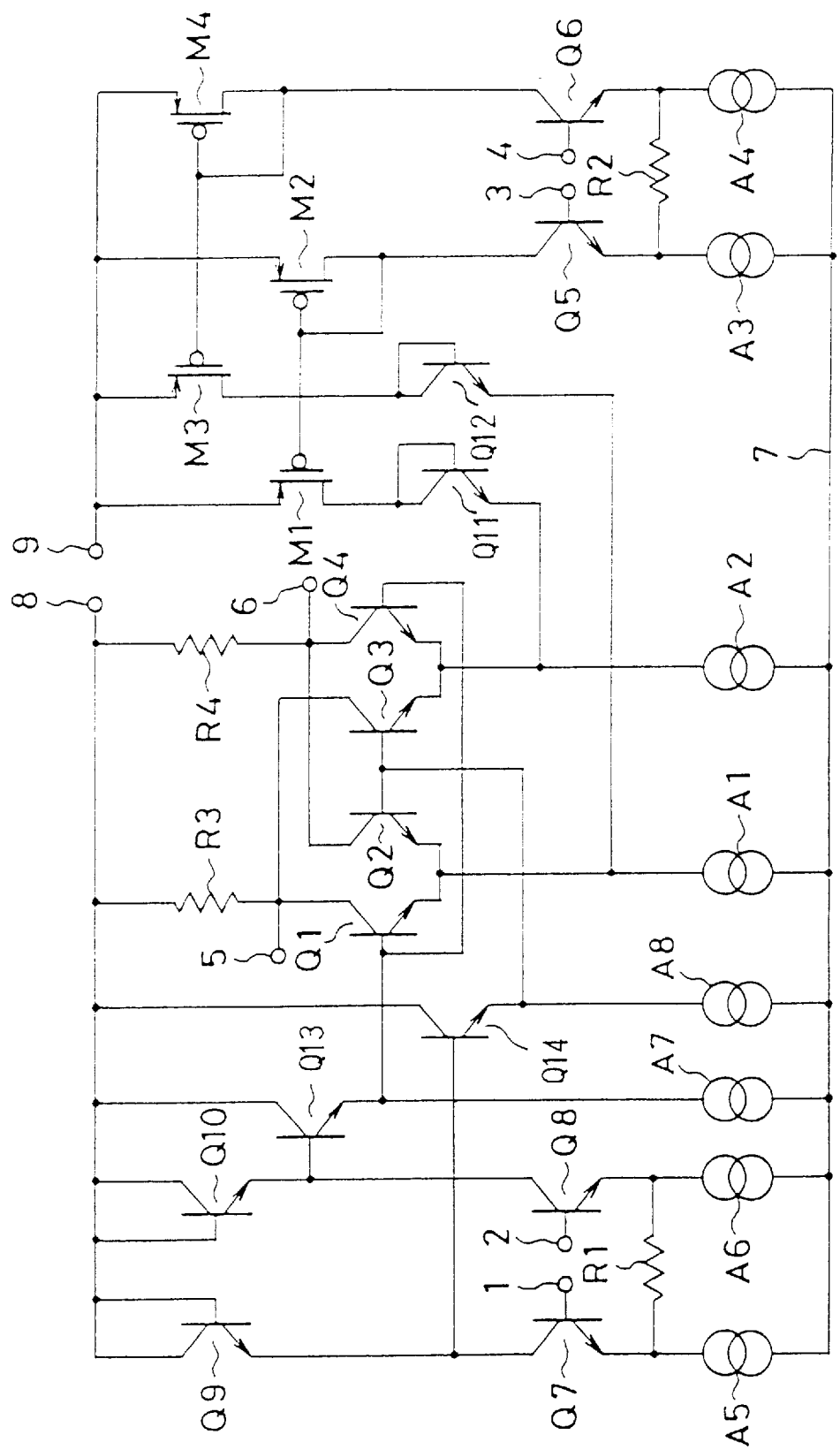

FIG. 7 shows a sixth embodiment of the present invention. In FIG. 7, the same structural elements as the elements shown in FIG. 5 are designated by identical references. The following description will concentrate on the differences between the fourth and sixth embodiments.

As shown in FIG. 7, the emitter of the transistor Q10 is connected to the base of an NPN type bipolar transistor Q13. The transistor Q13 has its collector connected to the high power source terminal 8 and has its emitter connected to a constant current source A7 and the bases of the transistors Q1 and Q4. The other end of the constant current source A7 is connected to the low power source terminal 7.

Likewise, the emitter of the transistor Q9 is connected to the base of an NPN type bipolar transistor Q14. The transistor Q14 has its collector connected to the high power source terminal 8 and has its emitter connected to a constant current source A8 and the bases of the transistors Q2 and Q3. The other end of the constant current source A8 is connected to the low power source potential 7.

While this embodiment basically operates in the same manner as the fourth embodiment, it is capable of increasing the output range for the following reason. In the circuitry shown in FIG. 5, the base potentials of the transistors Q1–Q4 are determined by a difference produced by subtracting from the high power source terminal 8 the base-emitter potentials of the diode-connected transistors Q9 and Q10, so that the lower limit of the output range is determined by the base potentials of the transistors Q1–Q4. In the embodiment shown in FIG. 7, the base potentials of the transistors Q1–Q4 are determined by a difference produced by subtracting from the high power source terminal 8 the base-emitter voltages of the transistors Q9 and Q10 and the base-emitter voltages of the transistors Q13 and Q14. Therefore, the base potential of the differential pair Q1 and Q2 and that of the differential pair Q3 and Q4 are lower than in the circuitry of FIG. 5 by a value corresponding to a single base-emitter potential.

In summary, it will be seen that the present invention provides an analog multiplier having the following unprecedented advantages. In an input portion for feeding a differential current to the interconnected emitters of each of a first and a second differential pair, the differential current is turned back by a current mirror circuit. This allows transistors limiting an input range to operate over a broad range in the forward active region of the collector potential. As a result, the multiplier achieves a broad input range.

Further, the base potentials of transistors limiting an output range are lowered by emitter followers. Therefore, such transistors can operate over a broad range in the forward active region of the collector potential.

Various modifications will become possible for those skilled in the art after receiving the teachings of the present disclosure without departing from the scope thereof. For example, the embodiment shown in FIG. 2 may be modified such that the differential current output from the differential pair Q7 and Q8 is turned back by a first and a second current-mirror circuit, further turned back by a third and a fourth current-mirror circuit, and then connected to a diode load. In this case, the terminal voltage of the diode load will be applied to the base of the cross-connected differential pair.

What is claimed is:

1. An analog multiplier comprising:
   a first and a second cross-connected differential pair applied with a first input signal voltage and having common emitters respectively driven by differential currents corresponding to a second input signal voltage;
   a third differential pair applied with said second input signal voltage; and
   a first and a second current mirror circuit for respectively turning back differential output currents output from said third differential pair to thereby feed said differential output currents to said common emitters of said first and second differential pairs;
   wherein differential currents proportional to a product of said first and second input signal voltages are output on cross-connected points of said first and second differential pairs.

2. A multiplier as claimed in claim 1, wherein said third differential pair has emitters connected to each other by a resistor and has said emitters driven by a first and a second constant current source, respectively.

3. A multiplier as claimed in claim 1, further comprising:
   a voltage-to-current transforming circuit for receiving said first input signal voltage and feeding a voltage corresponding to said first input signal voltage to said first and second differential pairs;
   a fourth differential pair for differentially receiving said first signal voltage and having emitters connected to each other by a resistor and having said emitters driven by a third and a fourth constant current source, respectively; and
   a diode load element connected to an output of said fourth differential pair.

4. A multiplier as claimed in claim 1, further comprising a first and a second emitter follower for respectively receiving outputs of said fourth differential pair and feeding respective outputs to said first and second differential pairs.

5. A multiplier as claimed in claim 1, wherein said first and second current mirror circuits each comprises MOS transistors.

6. A multiplier as claimed in claim 1, further comprising a third and a fourth current mirror circuit for respectively turning back outputs of said first and second current mirror circuits, wherein said third and fourth current mirror circuits are respectively connected to said common emitters of said first and second differential pairs.

7. A multiplier as claimed in claim 6, further comprising a third and a fourth constant current source for respectively driving said common emitters of said first and second differential pairs, wherein said common emitters of said first and second differential pairs are respectively connected to output ends of said second and first current mirror circuits.

8. A multiplier as claimed in claim 7, wherein said first and second current mirror circuits each comprises bipolar transistors.

9. A multiplier as claimed in claim 8, further comprising a fifth and a sixth constant current source for respectively driving said common emitters of said first and second differential pairs, wherein said common emitters of said first and second differential pairs are respectively connected to output ends of said second and first current mirror circuits.

10. A multiplier as claimed in claim 1, further comprising a first and a second constant current source for respectively driving said common emitters of said first and second differential pairs, wherein said common emitters of said first and second differential pairs are respectively connected to output ends of said second and first current mirror circuits.

11. An analog multiplier comprising:

a first differential pair comprising a first and a second transistor having bases to which a first input signal is differentially input, having emitters connected to each other by a first resistor, and having said emitters connected to a first power source terminal via a first and a second constant current source, respectively;

a third and a fourth diode-connected transistor respectively connected between collectors of said first and second transistors and a second power source terminal;

a second differential pair comprising a fifth and a sixth transistor having bases to which a second input signal is differentially input, having emitters connected to each other by a second resistor, and having said emitters connected to a second power source terminal via a third and a fourth constant current power source, respectively;

a first and a second current mirror circuit respectively connecting collectors of said fifth and sixth transistors to MOS transistors positioned at input stages;

a third differential pair comprising a seventh and an eighth transistor having emitters connected to each other, said collector of said first and second transistors being respectively connected to bases of said seventh and eighth transistors; and a fourth differential pair comprising a ninth and a tenth transistors having emitters connected to each other, said collectors of said second and first transistors being respectively connected to bases of said ninth and tenth transistors;

said emitters of said seventh and eighth transistors being connected to a MOS transistor of said first current mirror circuit positioned at an output stage;

said emitters of said ninth and tenth transistors being connected to a MOS transistor of said second current mirror circuit positioned at an output stage;

said seventh and ninth transistors having collectors connected to each other and connected to said second power source terminal via a first load resistor;

said eighth and tenth transistors having collectors connected to each other and connected to said second power source terminal via a second load resistor.

12. An analog multiplier comprising:

a first differential pair comprising a first and a second transistor having bases to which a first input signal is differentially input, having emitters connected to each other by a first resistor, and having said emitters connected to a first power source terminal via a first and a second constant current source, respectively;

a third and a diode-connected fourth transistor respectively connected between collectors of said first and second transistors and a second power source terminal;

a second differential pair comprising a fifth and a sixth transistor having bases to which a second input signal is differentially input, having emitters connected to each other by a second resistor, and having said emitters connected to said first power source terminal via a third and a fourth constant current source, respectively;

a first and a second current mirror circuit for respectivey connecting collector outputs of said fifth and sixth transistors to MOS transistors positioned at input stages, and respectively turning back collector currents of said fifth and sixth transistors via MOS transistors positioned at output stages;

a third and a fourth current mirror circuit comprising MOS transistors for respectively receiving currents output from said first and second current mirror circuits and then turning back said currents;

a third differential pair comprising a seventh and an eighth transistor having bases to which said collectors of said first and second transistors are respectively connected; and a fourth differential pair comprising a ninth and a tenth transistor having emitters connected to each other and bases to which said collectors of said second and first transistors are respectively connected;

said seventh and eight transistors having said emitters connected to an output end of said third current mirror circuit;

said ninth and tenth transistors having said emitters connected to an output end of said fourth current mirror circuit;

said seventh and ninth transistors having collectors connected to each other and connected to said second power source terminal via a first load resistor;

said eighth and tenth transistor having collectors connected to each other and connected to said second power source terminal via a second load resistor.

13. An analog multiplier comprising:

a first differential pair comprising a first and a second transistor having bases to which a first input signal is differentially input, having emitters connected to each other by a first resistor, and having said emitters connected to a first power source terminal via a first and a second constant current source, respectively;

a third and a diode-connected fourth transistor respectively connected to collectors of said first and second transistors and a high power source terminal;

a second differential pair comprising a fifth and a sixth transistor having bases to which a second input signal is differentially input, having emitters connected to each other by a second resistor, and having said emitters connected to said first power source terminal via a third and a fourth constant current power source, respectively;

a first and a second current mirror circuit for respectively connecting collector outputs of said fifth and sixth transistors to MOS transistors positioned at input stages, and respectively turning back collector currents output from said fifth and sixth transistors via MOS transistors positioned at output stages;

a third differential pair comprising a seventh and an eighth transistor each having emitters connected to each other, said collectors of said first and second transistors being respectively connected to bases of said seventh and eighth transistors; and a fourth differential pair comprising a ninth and tenth transistors each having emitters connected to each other, said collectors of said second and first transistors being respectively connected to bases of said ninth and tenth transistors;

said seventh and eighth transistors having said emitters connected to a fifth constant current source and an output end of said second current mirror circuit;

said ninth and tenth transistors having said emitters connected to a sixth current source and an output end of said first current mirror circuit;

said seventh and ninth transistors having collectors connected to each other and connected to said second power source terminal via a first load resistor;

said eighth and tenth transistors having collectors connected to each other and connected to said second power source terminal via a second load resistor.

14. An analog multiplier comprising:

a first differential pair comprising a first and a second transistor having bases to which a first input signal is differentially input, having emitters connected to each other by a first resistor, and having said emitters connected to a first power source terminal via a first and a second constant current source, respectively;

a third and a fourth diode-connected transistor respectively connected to collectors of said first and second transistors and to a high power source terminal;

a second differential pair comprising a fifth and a sixth transistor having bases to which a second input signal is differentially input, having emitters connected to each other, and having said emitters connected to said first power source terminal via a third and a fourth constant current source, respectively;

a first and a second current mirror circuit for respectively connecting collector outputs of said fifth and sixth transistors to MOS transistors positioned at input stages, and respectively turning back collector currents of said fifth and sixth transistors via MOS transistors positioned at output stages;

a third differential pair comprising a seventh and an eighth transistor having emitters connected to each other and bases to which said collectors of said first and second transistors are respectively connected; and a fourth differential pair comprising a ninth and a tenth transistor having emitters connected to each other and bases to which said collectors of said second and first transistors are respectively connected;

said seventh and eight transistors having said emitters connected to a fifth constant current source and connected to an output end of said second current mirror circuit via an eleventh diode connected transistor;

said ninth and tenth transistors having said emitters connected to a sixth constant current source and connected to an output end of said first current mirror circuit via a twelfth diode connected transistor;

said seventh and ninth transistors having collectors connected to each other and connected to said second power source terminal via a first load resistor;

said eighth and tenth transistors having collectors connected to each other and connected to said second power source terminal via a second load resistor.

15. Analog multiplier comprising:

a first differential pair comprising a first and a second transistor having bases to which a first input signal is differentially input, having emitters connected to each other by a first resistor, and having said emitters connected to a first power source terminal via a first and a second constant current source, respectively;

a third and a fourth diode-connected transistor respectively connected between collectors of said first and second transistors and a high power source terminal;

a second differential pair comprising a fifth and a sixth transistor having bases to which a second input signal is differentially input, having emitters connected to each other by a second resistor, and having said emitters connected to said first power source terminal via a third and a fourth constant current source, respectively;

a first and a second current mirror circuit for respectively connecting collector outputs of said fifth and sixth transistors to bipolar transistors positioned at input stages, and respectively turning back collector currents of said fifth and sixth transistors via bipolar transistors positioned at output stages;

a third differential pair comprising a seventh and an eighth transistor having emitters connected to each other and bases to which said collectors of said first and second transistors are respectively connected; and a fourth differential pair comprising a ninth and a tenth transistor having emitters connected to each other and bases to which said collectors of said second and first transistors are respectively connected;

said seventh and eighth transistors having said emitters connected to a third constant current source and connected to an output end of said second current mirror circuit via an eleventh diode-connected transistor;

said ninth and tenth transistors having said emitters connected to a fourth constant current source and connected to an output end of said first current mirror circuit via a twelfth diode-connected transistor;

said seventh and ninth transistors having collectors connected to each other and connected to said second power source terminal via a first load resistor;

said eighth and tenth transistors having collectors connected to each other and connected to said second power source terminal via a second load resistor.

16. An analog multiplier comprising:

a first differential pair comprising a first and a second transistor having bases to which a first input signal is differentially input, having emitters connected to each other by a first resistor, and having said emitters connected to a first power source terminal via a first and a second constant current source, respectively;

a third and a diode-connected fourth transistor respectively connected between collectors of said first and second transistors and a high power source terminal;

a second differential pair comprising a fifth and a sixth transistor having bases to which a second input signal is differentially input, having emitters connected to each other by a second resistor, and having said emitters connected to said first power source terminal via a third and a fourth constant current source, respectively;

a first and a second current mirror circuit for respectively connecting collector outputs of said fifth and sixth transistors to MOS transistors positioned at input stages, and respectively turning back collector currents of said fifth and sixth transistors via MOS transistors positioned at output stages;

a third differential pair comprising a seventh and an eighth transistor having emitters connected to each other and bases to which outputs of a first and a second emitter follower receiving collector currents of said first and second transistors, respectively, are respectively connected; and a fourth differential pair comprising a ninth and a tenth transistor having emitters connected to each other and bases to which said outputs of said second and first emitter followers are respectively connected;

said seventh and eighth transistors having said emitters connected to a third constant current source and connected to an output end of said second current mirror circuit via an eleventh diode-connected transistor;

said ninth and tenth transistors having said emitters connected to a fourth constant current source and connected to an output end of said first current mirror circuit via a twelfth diode-connected transistor;

said seventh and ninth transistors having collectors connected to each other and connected to said second power source terminal via a first load resistor;

said eighth and tenth transistors having collectors connected to each other and connected to said second power source terminal via a second load resistor.

* * * * *